United States Patent [19]

Coleman

[11] 3,707,765

[45] Jan. 2, 1973

[54] METHOD OF MAKING ISOLATED SEMICONDUCTOR DEVICES

[75] Inventor: Michael G. Coleman, Tempe, Ariz.

[73] Assignee: Motorola, Inc., Franklin Park, Ill.

[22] Filed: Nov. 19, 1970

[21] Appl. No.: 90,960

[52] U.S. Cl. ..................29/578, 148/1.5, 250/49.5 T

[51] Int. Cl. ..............................................B01j 17/00

[58] Field of Search ..148/1.5; 250/49.5 T; 29/576 B, 29/578; 317/235

[56] References Cited

UNITED STATES PATENTS

| | | | |
|---|---|---|---|
| 3,586,542 | 6/1971 | MacRae | 148/1.5 |
| 3,622,382 | 11/1971 | Brack et al. | 117/201 |
| 3,655,457 | 4/1972 | Duffy et al | 148/1.5 |

OTHER PUBLICATIONS

IBM Technical Disclosure Bulletin – Fairfield et al., Contacting Buried Ion Implanted Layers – Vol. 13, No. 5 – Oct. 1970, page 1052

*Primary Examiner*—Charles W. Lanham
*Assistant Examiner*—W. Tupman
*Attorney*—Mueller & Aichele

[57] ABSTRACT

After a semiconductor device is completed and tested, it is electrically isolated from the substrate by ion implantation of a boat or dish of insulating material in the substrate and surrounding the semiconductor device.

3 Claims, 3 Drawing Figures

INVENTOR.
Michael G. Coleman
BY
Mueller & Aichele
ATTY'S.

METHOD OF MAKING ISOLATED SEMICONDUCTOR DEVICES

BACKGROUND

When, in accordance with the prior art, it is desired to provide electrically isolated semiconductive devices in a substrate, grooves are provided in the surface of the semiconducting substrate and a layer of insulator is grown on the surface of the substrate and in the grooves and enough further material is added to the layer so as to provide a supporting substrate. Then, the original semiconductive substrate is removed to the bottom of the grooves, leaving electrically isolated islands of semiconductive material in a substrate. The islands of semiconductive material were changed to or processes to provide transistors or diodes or other semiconductive devices in the usual manner as by diffusing or alloying in a known manner. This prior art method has several disadvantages, which include the many steps necessary to provide the isolation and the fact that all the isolation producing steps are taken before the semiconductive device is made. Therefore, if the semiconductive device is defective, all the isolation producing steps are wasted.

It is an object of this invention to produce isolated semiconductive devices with a minimum number of steps.

It is a further object of this invention to produce the semiconductive device first, and then, if upon test, the device is acceptable, to then provide the electrical isolation.

SUMMARY

According to this invention, the semiconductive device may be formed in or on a semiconductive substrate and then, an insulating boat or dish is formed in the substrate around the semiconductive device, the boat or dish extending from the surface surrounding the semiconductive device down and under the semiconductive device. This boat may be made by implantation of such ions as will produce an insulating layer, either alone or by forming a compound with the material of the semiconducting substrate. This boat may be produced after the semiconductive device is completed and tested, whereby the boat would not be made if a semiconductive device is defective.

DESCRIPTION

The invention will be better understood upon reading the following description when taken with the accompanying drawing in which.

Figure 1:
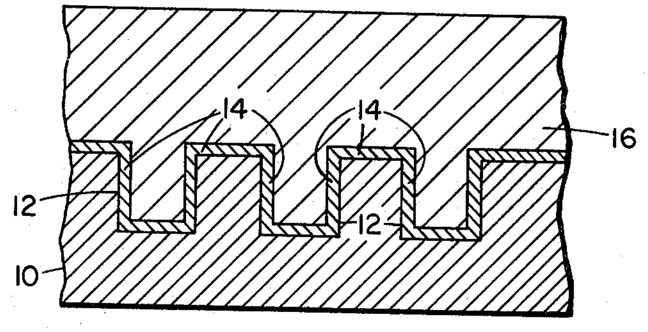
FIGS. 1 and 2 illustrate the method of the prior art.
Figure 2:
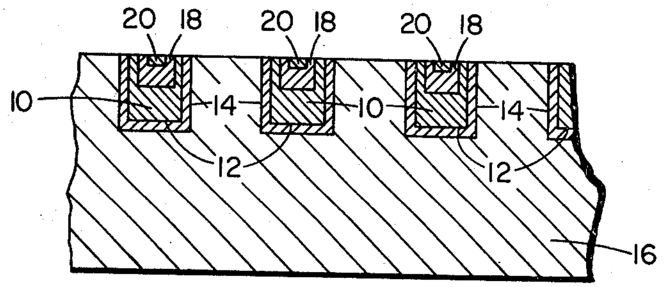

Turning first to FIG. 1, a semiconductive substrate 10 is provided with a smooth upper surface. This substrate may be N-type or P-type material. Then grooves 12 are provided in the upper surface, as viewed in FIG. 1, of the substrate 10. Then, insulating material 14 is provided on the complete grooved surface of the substrate 10, including the inner surfaces of the grooves 12. Then, enough more material which may or may not be insulating is provided on the surface 14 to fill the grooves 12 and to provide a supporting insulating layer or substrate 16. Then, see FIG. 2, the composite substrate of FIG. 1 is turned over and the original semiconductive substrate 10 and the insulating layer material 14 that was provided on the outer surface of the substrate is ground or etched or otherwise removed leaving the insulating substrate 16, the grooves 12, the insulating layer 14 on the inner surfaces of the grooves 12, and the semiconductor material 10 that remains of the original substrate 10 between the grooves 12. Then, if transistors are to be made, semiconductive material 18 of the opposite conductivity type to that of the material 10 is provided in any known manner in the material 10 and semiconductive material 20 of the same conductivity type as that of the material 10 is provided in the material 18. If the material 10 were N type originally, then an NPN transistor is provided and if the material were P originally, then a PNP transistor is provided. If a diode is desired, only the material 18 is provided, material 20 not being provided.

It will be noted that the prior art method as just described includes a many step process for forming the islands of semiconductive material 10 in the insulating substrate comprising the thin layer 14 and the thicker layer 16. It will further be noted that the useful part of the device, that is the transistor or the diode, is not made until after the insulated islands are formed, whereby, tests on the transistor or diode cannot be made until many steps have been taken, which would be wasted if the transistor or diode tested out as being defective. In accordance with the method of this invention, which is illustrated in connection with the large scale drawing of FIG. 3, the transistor or diode to be insulated is made first and then, after tests are made thereon, the insulation is provided in a much simpler manner than in the prior art method.

Figure 3:
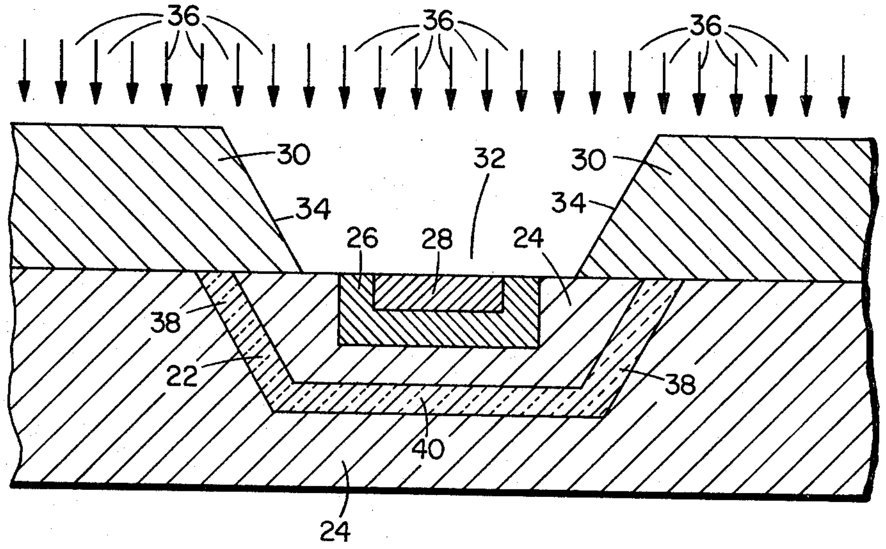
FIG. 3 illustrates the method of this invention at a larger scale.

The insulating boat or dish 22 of FIG. 3 is made by ion implantation. Ions of an element are projected against the upper face as viewed in FIG. 3 of a semiconductive substrate 24, as indicated by the arrows 36. It is known that upon projecting ions at a surface at a low velocity or energy, the surface will be plated with the material of the ions. If the energy of the ions is greater, the ions will penetrate the surface and be deposited just below the surface. If the ions have still greater energy, the ions will penetrate the surface and will be deposited in a layer all of which is below the surface, at a depth which is dependent upon the average velocity of the ions. The material may be chosen for the proper effect. For example, if the substrate is of an N-type or P-type silicon, the ions may be of oxygen to provide an insulating boat of $SiO_2$, or the ions may be of nitrogen to provide an insulating boat of $Si_3N_4$. In fact, the ions may be of silicon in which case an insulating boat can be provided by so destroying the doped silicon substrate with the silicon ions as to produce an insulating boat of so damaged substrate material. If the substrate is of N- or P-type GaAs for example, the ions may be of chromium or of iron which when implanted in semiconductor GaAs renders it semiinsulative or non-conductive. Other ion implantation may be used to provide insulating boats or dishes in other types of semiconductive substrates.

Turning more particularly to FIG. 3, first the region 26 of material of the opposite conductivity type to that of the substrate is formed in the upper surface of the substrate 24 as viewed in FIG. 3. Then a region 28 of the same conductivity type as that of the substrate 24 is formed in the region 26, producing a transistor. This transistor is tested. (Or if a diode is desired, the region 28 is not made, and the diode is tested.) And then, assuming that the transistor or diode tests out to be acceptable, the insulating boat 22 is formed. A coating 30 of a material, which may be metal or dielectric or a combination of both (the combination not being shown in FIG. 3), is provided on the upper surface of the semiconductive substrate 24. Then a hole 32 having slanting sides 34 is provided in the coating 30 over the semiconductive device formed in the surface of the substrate 24. The coating 30 is made so thick as to stop ions, indicated by the arrows 36, which are projected against the surface of the substrate 24 in a known manner, from reaching the surface of the substrate 24. However, the slant of the sides 34 of the hole 32 is so chosen that the ions penetrate from a zero depth to the required depth in a direction away from the thicker portion of the layer 30. The ions are completely stopped by the layer 30 or are slowed down less and less by the decreasing thickness of the layer 30 under the slanting sides 34. The result is that the dish or boat 22 of insulating material is formed in the semiconductive substrate 24, which has slanting sides 38, which slant downward as they approach each other and a bottom portion 40 is formed integrally joining the bottom edges of the sides 38, some of the semiconductive material 24 and the regions 26 and 28 therein being in the boat or dish 22. While not shown, the ends of the boat or dish 22 may be formed by terminating the holes 32 with slanting walls 34 in the directions that are not shown. The ion bombardment does not hurt the semiconductor device shown in the drawing since the ions go completely therethrough without stopping and doing no noticeable damage. It will also be noted that the steps for making the dish or boat 22 are simpler, fewer, and are easier to do than steps for making the islands comprising the semiconductive material 10 of FIGS. 1 and 2. Other similar semiconductive devices similarly insulated from the major portion of the substrate may be provided in the substrate 24 simultaneously with the one shown by making a plurality of holes 32 each with slanting sides 34 in the layer 30 at desired locations with respect to other semiconductive devices as described hereinabove.

It is sometimes desirable to have a very thin coating (not shown) which may be of the same material as the material 30, covering the bottom of the hole 32 to protect the exposed surface from possible damage by the ion beam. The thin coating is so thin that it does not appreciably react with the ion beam.

What is claimed is:

1. A method of providing an integrated semiconductor device having therein electrically isolated semiconductor components within a substrate comprising the steps of:

a. fabricating semiconductor components within the substrate proximate to a surface thereof and testing said components;

b. providing a suitable masking layer on the surface of the substrate, for preventing high energy ions from being implanted in the substrate, the masking layer having apertures each aperture exposing one of the semiconductor components to be isolated and found to be operable as a result of testing, and each aperture having sloping walls, whereby when the surface of the semiconductor device is bombarded by suitable high energy ions an insulating bowl-like layer is implanted having a relatively flat bottom beneath each of the semiconductor components to be isolated co-extensive with the exposed surface and having sloping walls extending to the surface of the substrate and having slope corresponding to the slope of the aperture walls, thereby completely electrically isolating each semiconductor component from the substrate and from other semiconductor components thereon;

c. bombarding the surface of the semiconductor device with suitable high energy ions, whereby the masking layer masks the ions from being implanted into the substrate at the thickest portions of the masking layer, and provides gradually decreased velocity of bombarding ions along the sloping walls toward the exposed surface of a substrate so that a bowl-like isolation layer having sides extending to the surface of the substrate is implanted beneath each aperture, thereby electrically isolating a semiconductor component thereat.

2. The method of claim 1 wherein the substrate is silicon, and the implanted ions are chosen from the group including oxygen, nitrogen, and silicon.

3. The method of claim 1 wherein the substrate is GaAs and the implanted ions are from the group including chromium and iron.

* * * * *